(12) United States Patent
Han et al.

(10) Patent No.: US 10,546,821 B2
(45) Date of Patent: Jan. 28, 2020

(54) OPENING IN A MULTILAYER POLYMERIC DIELECTRIC LAYER WITHOUT DELAMINATION

(71) Applicant: Texas Instruments Incorporated, Dallas, TX (US)

(72) Inventors: Licheng Marshal Han, Frisco, TX (US); Michael Andrew Serafin, Richardson, TX (US); Byron Williams, Plano, TX (US); Sandra Rodriguez Varela, Allen, TX (US); Salvatore Pavone, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/293,557

(22) Filed: Oct. 14, 2016

(65) Prior Publication Data

US 2017/0033057 A1 Feb. 2, 2017

Related U.S. Application Data

(62) Division of application No. 14/576,784, filed on Dec. 19, 2014, now Pat. No. 9,502,365.

(Continued)

(51) Int. Cl.
*H01L 23/00* (2006.01)
*H01L 23/31* (2006.01)
*H01L 23/532* (2006.01)
*H01L 49/02* (2006.01)
*H01L 21/768* (2006.01)

(Continued)

(52) U.S. Cl.
CPC ...... *H01L 23/562* (2013.01); *H01L 21/31138* (2013.01); *H01L 21/31144* (2013.01); *H01L 21/56* (2013.01); *H01L 21/76801* (2013.01); *H01L 21/76802* (2013.01); *H01L 23/293* (2013.01); *H01L 23/3192* (2013.01); *H01L 23/5329* (2013.01); *H01L 23/53295* (2013.01); *H01L 24/05* (2013.01); *H01L 28/10* (2013.01); *H01L 21/784* (2013.01); *H01L 23/5227* (2013.01); *H01L 2224/02206* (2013.01); *H01L 2224/02215* (2013.01); *H01L 2224/05567* (2013.01); *H01L 2224/94* (2013.01); *H01L 2924/07025* (2013.01); *H01L 2924/14* (2013.01); *H01L 2924/19042* (2013.01);

(Continued)

(58) Field of Classification Search
CPC ........ H01L 21/76802; H01L 23/53295; H01L 23/562; H01L 2924/3512–35121; H01L 21/76801; H01L 2224/02205; H01L 2224/0221; H01L 2224/02215; H01L 2224/05567; H01L 2224/05571
See application file for complete search history.

(56) References Cited

U.S. PATENT DOCUMENTS 3,546,013 A * 12/1970 Riseman .................. C23C 8/80
257/634
4,692,205 A * 9/1987 Sachdev ............... G03F 7/0757
174/256

(Continued)

*Primary Examiner* — Joshua King
(74) *Attorney, Agent, or Firm* — Jacqueline J. Garner; Charles A. Brill; Frank D. Cimino

(57) ABSTRACT

An integrated circuit and method with a delamination free opening formed through multiple levels of polymer dielectric. The opening has a vertical sidewall and no interface between adjacent levels of polymer dielectric is exposed on the vertical sidewall.

23 Claims, 5 Drawing Sheets

Related U.S. Application Data

(60) Provisional application No. 61/922,397, filed on Dec. 31, 2013.

(51) Int. Cl.
*H01L 21/311* (2006.01)
*H01L 21/56* (2006.01)
*H01L 23/29* (2006.01)
*H01L 21/784* (2006.01)
*H01L 23/522* (2006.01)

(52) U.S. Cl.
CPC ............... *H01L 2924/19104* (2013.01); *H01L 2924/35121* (2013.01)

(56) References Cited

U.S. PATENT DOCUMENTS

| | | | | |
|---|---|---|---|---|
| 4,980,270 | A * | 12/1990 | Inasaka | H05K 3/0023 430/312 |
| 5,135,606 | A * | 8/1992 | Kato | H01L 21/486 205/135 |
| 5,284,801 | A * | 2/1994 | Page | H01L 21/76801 257/E21.576 |
| 6,391,785 | B1 * | 5/2002 | Satta | H01L 23/53252 257/E21.171 |
| 6,511,916 | B1 * | 1/2003 | Wu | G03F 7/427 257/E21.256 |
| 6,576,982 | B1 * | 6/2003 | You | H01L 21/76802 257/639 |
| 6,686,271 | B2 * | 2/2004 | Raaijmakers | C23C 16/045 257/E21.171 |
| 6,737,222 | B2 * | 5/2004 | Subramanian | G03F 7/0035 257/E21.027 |
| 7,572,727 | B1 * | 8/2009 | Li | H01L 21/76804 438/624 |
| 8,334,218 | B2 * | 12/2012 | Van Nooten | C23C 16/045 257/E21.214 |
| 8,679,972 | B1 * | 3/2014 | Rozbicki | H01L 21/76805 438/662 |
| 8,736,050 | B2 * | 5/2014 | Huang | H01L 24/11 257/621 |
| 2002/0187638 | A1 * | 12/2002 | Nakagawa | H01L 21/0273 438/689 |
| 2003/0143839 | A1 * | 7/2003 | Raaijmakers | H01L 21/28556 438/633 |
| 2004/0009663 | A1 * | 1/2004 | Yu | H01L 21/76804 438/674 |
| 2004/0038520 | A1 * | 2/2004 | Seto | H01L 21/76807 438/637 |
| 2004/0175925 | A1 * | 9/2004 | Park | H01L 21/31138 438/623 |
| 2005/0014359 | A1 * | 1/2005 | Segawa | C23C 18/50 438/622 |
| 2005/0167839 | A1 * | 8/2005 | Wetzel | H01L 21/76802 257/758 |
| 2007/0013069 | A1 * | 1/2007 | Tada | H01L 21/76802 257/758 |
| 2008/0230906 | A1 * | 9/2008 | Wong | H01L 21/76802 257/751 |
| 2008/0290469 | A1 * | 11/2008 | Grivna | H01L 23/585 257/620 |
| 2013/0005147 | A1 * | 1/2013 | Angyal | H01L 21/31116 438/692 |
| 2013/0241049 | A1 * | 9/2013 | Yu | H01L 23/585 257/737 |
| 2014/0084464 | A1 * | 3/2014 | Chen | H01L 23/53295 257/741 |
| 2014/0084471 | A1 * | 3/2014 | Peng | H01L 23/53238 257/751 |
| 2014/0151698 | A1 * | 6/2014 | Chen | H01L 22/34 257/48 |
| 2015/0162219 | A1 * | 6/2015 | Terai | H01L 24/37 257/77 |
| 2017/0309513 | A1 * | 10/2017 | Zhou | H01L 21/76826 |

\* cited by examiner

OPENING IN A MULTILAYER POLYMERIC DIELECTRIC LAYER WITHOUT DELAMINATION

CROSS-REFERENCE TO RELATED APPLICATIONS

This application is a divisional of U.S. Nonprovisional patent application Ser. No. 14/576,784, filed Dec. 19, 2014, which claims the benefit of U.S. Provisional Application 61/922,397, filed Dec. 31, 2013, the contents of both of which are herein incorporated by reference in its entirety.

FIELD OF INVENTION

This invention relates to the field of integrated circuits. More particularly, this invention relates to polymeric dielectric layers in integrated circuits.

BACKGROUND

Integrated circuits that include such devices as capacitors, inductors, and transformers often use multiple levels of polymeric dielectrics such as polyimides and photosensitive polyimides to provide electrical isolation. High voltage applications require thick layers of the polymeric dielectric to provide reliable isolation.

Polymeric materials shrink when cured. Thick polymeric layers may delaminate when cured due to stresses created by the shrinkage during the cure. To reduce delamination, thick layers of polymeric dielectric may be formed by repeated polymer dielectric deposition and cure cycles. While this may significantly reduce delamination it may not be eliminated.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method with a delamination free opening formed through multiple levels of polymer dielectric. The opening has a vertical sidewall and no interface between adjacent levels of polymer dielectric is exposed on the vertical sidewall.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

It has been discovered that delamination between multiple layers of polymer dielectric may be eliminated by avoiding the formation on an exposed interface between two layers of polymer dielectric on a vertical surface. For example, if an interface is exposed on the sidewall of a contact opening, on the sidewall of a bondpad opening, or on the sidewall of a scribe seal, delamination may occur at the interface.

In a first embodiment the upper polymer dielectric layer may overlap the lower dielectric layer so that the edge of the lower polymer dielectric layer is covered with the upper dielectric layer. In a second embodiment, the edge of an upper layer of polymer dielectric may be pulled back (stair stepped) away from the edge of the lower polymer dielectric so the interface is no longer exposed on a vertical surface.

Figure 1A:
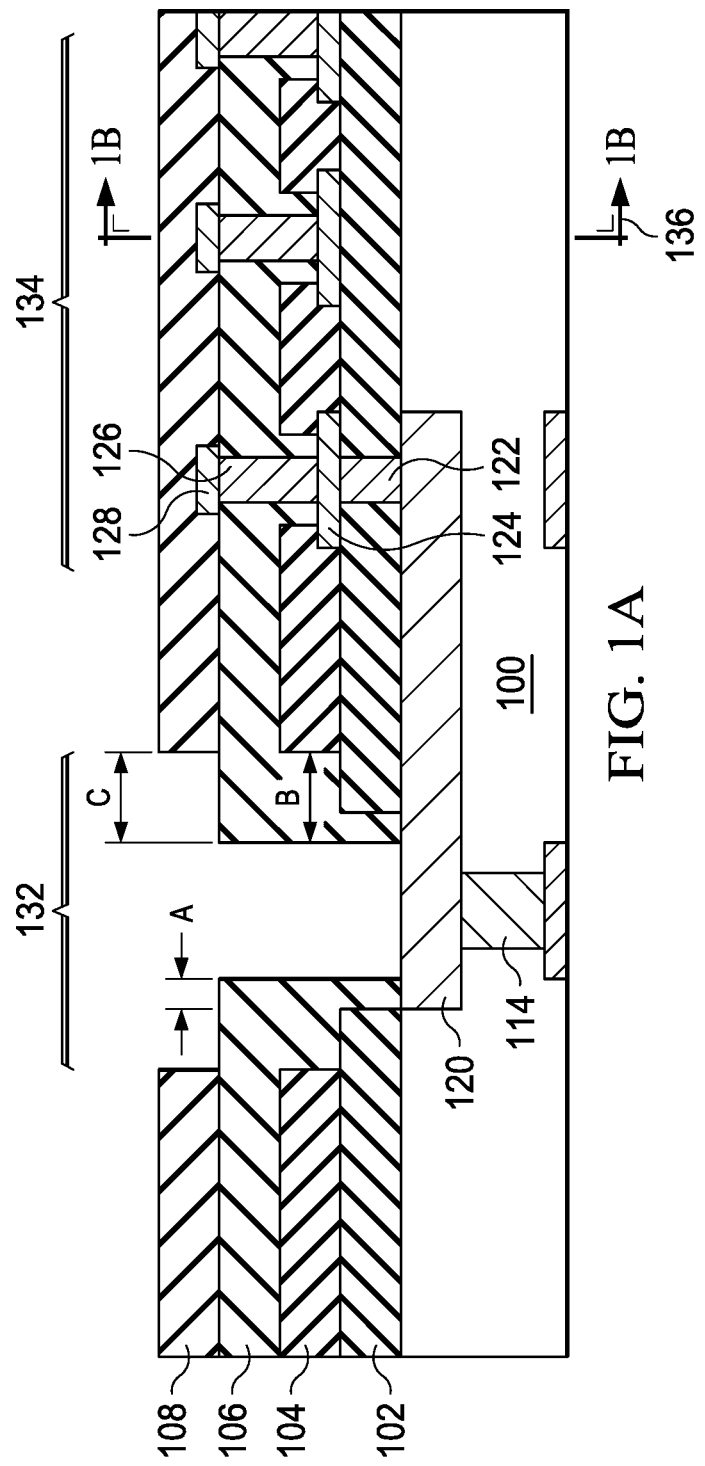
FIGS. 1A and 1B are cross-sections of an integrated circuit with a contact formed through multiple levels of a polymeric dielectric according to principles of the invention.
Figure 1B:
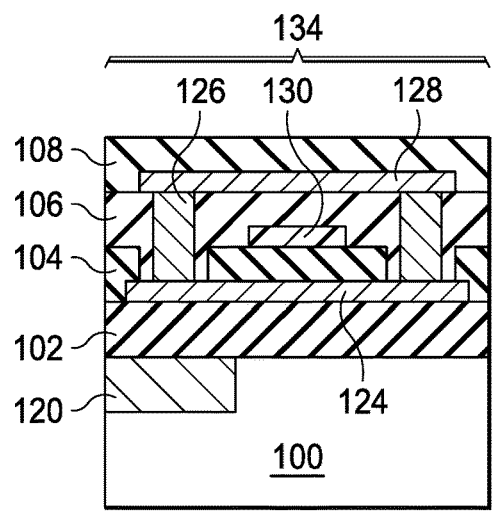

An inductor formed using multiple polymer dielectric layers 102, 104, 106, and 108 illustrates both embodiments in FIGS. 1A and 1B. FIG. 1B shows a cross section through the inductor core 130 along cut line 136 in FIG. 1A. Interfaces (ie. between polymer dielectric layers 102 and 104, between polymeric layers 104 and 106, and between polymeric layers 106 and 108) which would be exposed on the vertical sidewalls in contact opening 132 using a conventional process are avoided.

First polymeric layer 102 is spaced from the contact opening 132 by a distance A. Second polymeric layer 104 which is formed on top of layer 102 is spaced from the contact opening in layer 102 by a distance B. Distance B is larger than distance A so the edge of second polymer layer 104 is stair stepped away from the contact opening 132 on top of first polymer 102 by a distance equal to B minus A. Third polymeric layer 106 is formed over layers 102 and 104, and covers the edges of underlying layers 104 and 102 in the contact opening 132. The third polymer layer 106 covers the interfaces between dielectric layers 104 and 102 and between dielectric layer 102 and the substrate 100. The contact opening 132 is formed in the third dielectric layer 106 so only the third dielectric is exposed on the vertical sidewalls of the contact opening 132. By avoiding exposure of the interfaces between layers 102 and 104 and between layers 104 and 106 in the contact opening 132, delamination is avoided.

Also shown in FIG. 1A the edge of top polymeric layer 108 which is formed on layer 106 is spaced from the edge of the contact opening 132 by a distance C. This avoids delamination at the interface between layer 108 and 106 which might occur if the opening in polymer dielectric layer 108 were the same size as the contact opening in polymeric dielectric layer 106 so that the interface between polymeric layers 108 and 106 would be exposed on the sidewall of the contact opening 132.

The inductor 134 used to illustrate an integrated circuit with multiple polymer dielectric layers 102, 104, 106, 108 consists of a metal inductor coil which surrounds a magnetic core 130 (FIG. 1B). The metal inductor coil is formed with bottom metal leads 124 and top metal leads 128 which are connected together by metal posts 126 to form the inductor coil. The bottom leads 124 of the inductor coil are electrically isolated from the underlying interconnect 120 by first polymeric dielectric layer 102. The inductor core 106 is electrically isolated from the bottom metal leads 124 by second polymer dielectric layer 104 and from the top metal leads 128 by third polymer dielectric layer 106. The metal posts 126 which connect the bottom metal leads 124 to the top metal leads 128 to form the inductor coil are formed in openings through polymer dielectric layers 104 and 106. The metal posts 126 are also electrically isolated from the inductor core 106 by polymer dielectric layers 104 and 106. A fourth polymer dielectric layer 108 is formed on top the top metal leads 128 to protect them from the environment.

The example IC in FIGS. 1A and 1B illustrate methods of forming a contact opening in 4 levels of polymer dielectric that avoids delamination at the interfaces between the multiple layers of the polymer dielectric.

Figure 2:
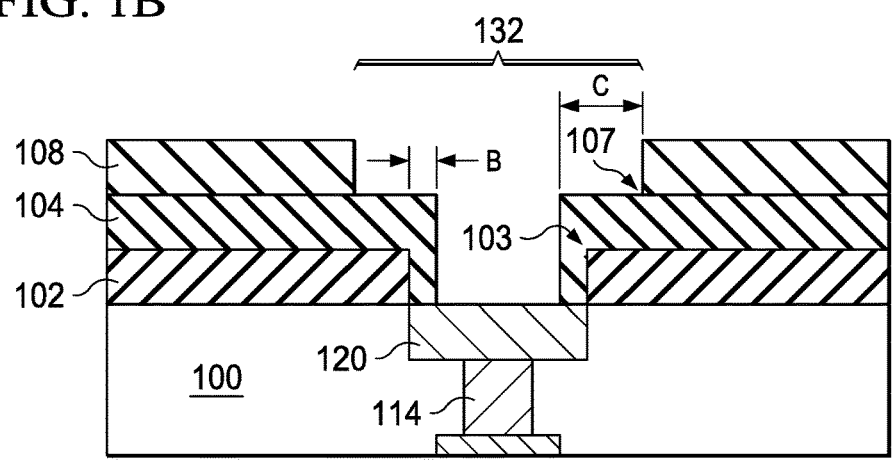
FIG. 2 is a cross-section of an integrated circuit with a contact formed through multiple levels of a polymeric dielectric according to principles of the invention.

An integrated circuit with 3 levels of polymer dielectric 102, 104, and 108 is illustrated in FIG. 2. In this example a contact opening in bottom first polymer dielectric layer 102 is larger than the contact opening 132 by a distance B. Second polymer dielectric layer 104 is formed on top of the first polymer dielectric layer 102. Contact opening 132 is formed in the second polymer dielectric layer 104 inside the contact opening in the first polymer dielectric layer 102. The edges of the first polymer dielectric layer 102 are covered with overlying second polymer dielectric layer within the contact. This prevents the interface edge 103 between the first polymer dielectric layer 102 and second polymer dielectric layer 104 from being exposed within the contact opening. This avoids delamination at this interface 103.

A third polymer dielectric layer 108 is formed on the second polymer dielectric layer 104 with a contact opening in the third polymer dielectric layer 108 that is larger than the IC contact opening 132 by a distance C. Design rule C prevents the edges of the contact opening in the third polymeric dielectric layer 108 from being collinear with the edge of polymer dielectric layer 104 within the integrated circuit (IC) contact opening 132. This avoids delamination at this interface 107.

Figure 3:
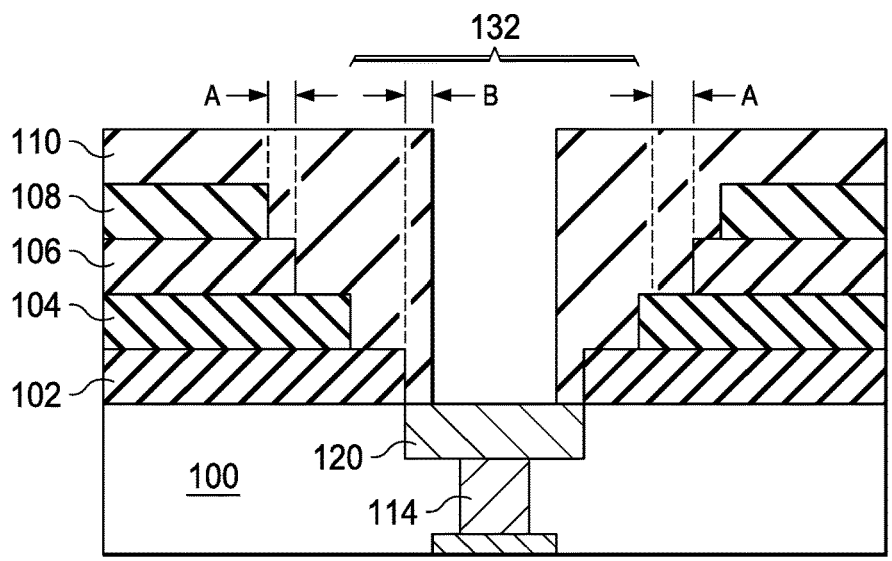
FIG. 3 is a cross-section of an integrated circuit with a contact formed through multiple levels of a polymeric dielectric according to principles of the invention.

An example with five polymeric dielectric layers, 102, 104, 106, 108, and 110 is illustrated in FIG. 3. In this example the IC contact 132 is formed through a single polymeric dielectric layer 110 which overlies the edges of the other dielectric layers 102, 104, 106, and 108 below it. The edges of the underlying dielectric layers 108, 106, 104, and 102 are stair stepped away from the IC contact 132 opening. The distance of each stair step may be the same or may be different. Polymer layer 110 is deposited over the underlying dielectric layers 108, 106, 104, 102 filling the contact openings in the underlying layers and covering the edges of the underlying layers. IC contact 132 which is smaller in diameter than the contact openings in each of the underlying dielectric layers 108, 106, 104, and 102 is formed to the underlying interconnect 120. The interface edges between the underlying polymer dielectric layers, 108, 106, 104, and 102 are covered by overlying polymer dielectric 110. IC contact 132 is formed through polymer dielectric layer 110 only so no interfaces are exposed on the sidewalls of the IC contact 132. This prevents delamination at the interfaces.

Figure 4:
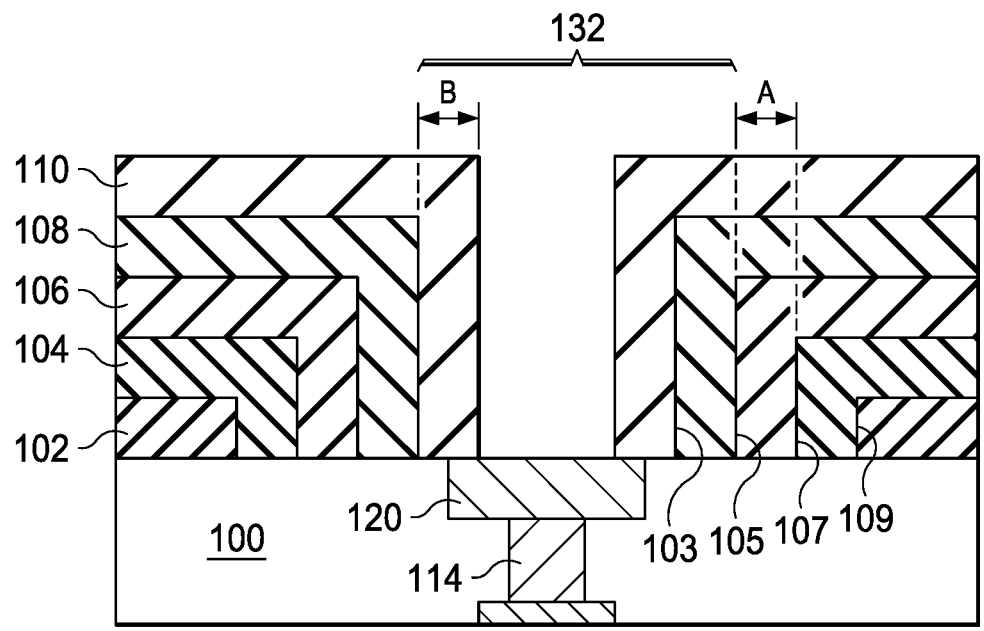
FIG. 4 is a cross-section of an integrated circuit with a scribe seal formed through multiple levels of a polymeric dielectric according to principles of the invention.

Another polymeric dielectric layer overlap structure with five layers of polymer dielectric is illustrated in FIG. 4. In this structure each overlying polymeric dielectric layer overlaps and covers the edge of the polymeric dielectric layer beneath it. Polymeric dielectric layer 104 covers the edge 103 of underlying polymeric dielectric layer 102. Polymeric dielectric layer 106 covers the edge 105 of underlying polymer dielectric layer 104. Polymeric dielectric layer 108 covers the edge 107 of underlying polymer dielectric layer 106. Polymeric dielectric layer 110 through which the contact 132 is formed covers the edge 109 of underlying polymer dielectric layer 108. Each overlying polymeric dielectric layer overlaps the edge of the underlying polymeric dielectric layer. The IC contact 132 is formed in polymeric dielectric 110. No interface edges are exposed on the vertical sidewalls of the IC contact 132 so no interface delamination may occur.

Figure 5:
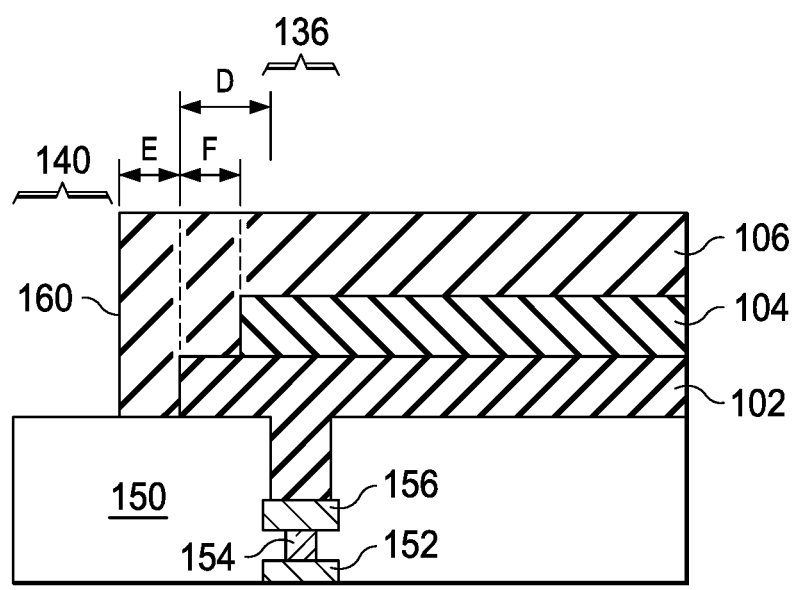
FIG. 5 is a cross-section of an integrated circuit with a scribe seal formed through multiple levels of a polymeric dielectric according to principles of the invention.

A delamination free scribe seal overcoat for integrated circuits with three levels of polymeric dielectric, 102, 104, and 106 is illustrated in FIG. 5. The scribe seal typically is comprised of a trench that is formed through multiple layers of dielectric 150 at the die edge and is filled with layers interconnect metal 152 and 156 and with contact and via metal 154. The scribe seal 136 is typically formed adjacent to the scribe lane 140. The edges of the four layers of polymeric dielectric are staggered or stair stepped so no interface edge is exposed on the edge 160 of the scribe seal.

Design rule D specifies the minimum distance the first (bottom) layer of polymeric dielectric 102 overlaps the scribe seal 136 in the direction of the scribe lane 140. In this example, the second layer of polymer dielectric 104 is stair stepped away from the scribe lane 140 by a distance F so the edge of the second layer of polymer dielectric 104 is not coincident with the edge of the first layer of polymer dielectric 102 to avoid delamination of the interface. The third layer of polymer dielectric 106 covers the edges of underlying polymer dielectric layers 104 and 106 forming a scribe seal edge of polymer dielectric 106 only. The third layer of polymer dielectric 106 overlaps the edge of the first polymer dielectric layer by a distance E. Distances D, E, and F may be the same or may be different.

The polymeric dielectric may be a spin-on photosensitive polymer such as polyimide, polybenzobisoxazole (PBO), SU-8 (epoxy-based photosensitive polymer), or BCB (benzocyclobutene-based photosensitive polymer). A photosensitive polyimide is used to illustrate the embodiment.

An example process for forming an IC contact in an integrated circuit with multiple levels of polymeric dielectric is illustrated in FIGS. 6A through 6E. An integrated circuit 100 with 4 levels of photosensitive polyimide is used to illustrate the process. A delamination free IC contact 132 is formed through 4 levels of photosensitive polyimide to a metal lead or bond pad 120 on an underlying integrated circuit 100.

Figure 6A:
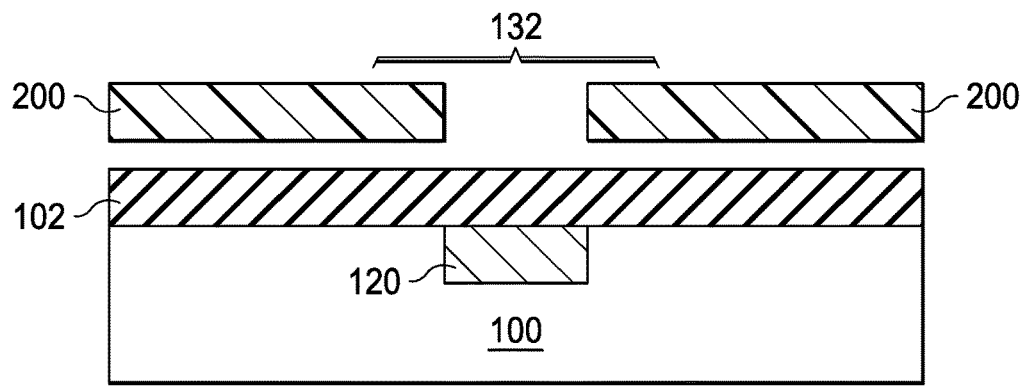
FIGS. 6A-6E are illustrations of steps in the fabrication of integrated circuits formed according to principles of the invention.

In FIG. 6A, a first photosensitive polyimide layer 102 is deposited over a bond pad 120 on an underlying integrated circuit 100. Using photo mask 200 a first contact opening is exposed in the first photosensitive polyimide layer 102.

Figure 6B:
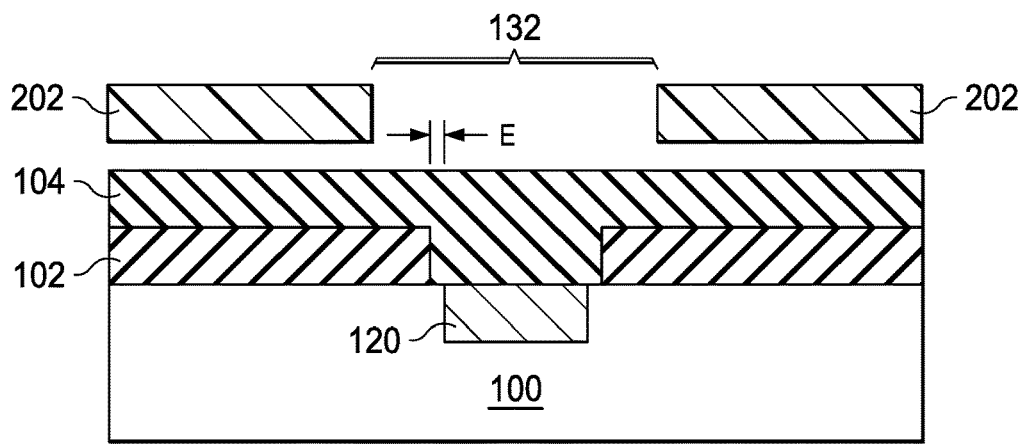

The first photosensitive polyimide layer 102 is then developed to form a first contact opening as illustrated in FIG. 6B. The first contact opening overlaps the underlying metal pad 120 by a distance E. The first photosensitive polyimide layer 102 is then cured by baking it at a temperature of about 400° C. for a time of about 60 min producing a final thickness of about 5 to 20 um.

FIG. 6B shows the integrated circuit 100 after a second photosensitive polyimide layer 104 is spin coated on the integrated circuit 100. A second contact opening is then exposed in the second photosensitive polyimide layer 102 using photo mask 202.

Figure 6C:
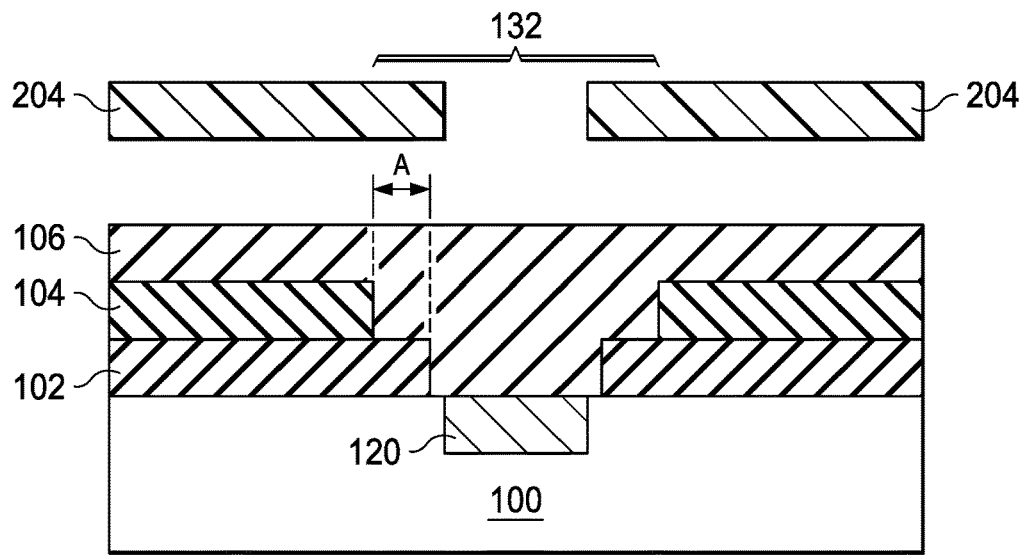

The second photosensitive polyimide layer 104 is developed after exposure to form the second contact as shown in FIG. 6C. The second contact opening is concentric with the first contact opening and larger than the first contact so the edge of the second polymer layer is stair stepped away from the first contact opening. A design rule A may be used to specify the distance the edge of the second photosensitive polyimide layer 104 is stair stepped back from the edge of the first contact opening. The second photosensitive polyimide layer 104 is then cured by baking it at a temperature of about 400° C. for a time of about 60 min producing a final thickness of about 5 to 20 um.

Referring again to FIG. 6C, a third layer 106 of photosensitive polyimide in which the IC contact 132 is to be formed may be deposited. The third layer of photosensitive polyimide 106 (IC contact layer) is deposited using spin-on coating after the second photosensitive polyimide layer 104 is exposed, developed, and cured. IC contact opening 132 is then exposed in the polyimide IC contact layer 106 using photo mask 204.

Figure 6D:
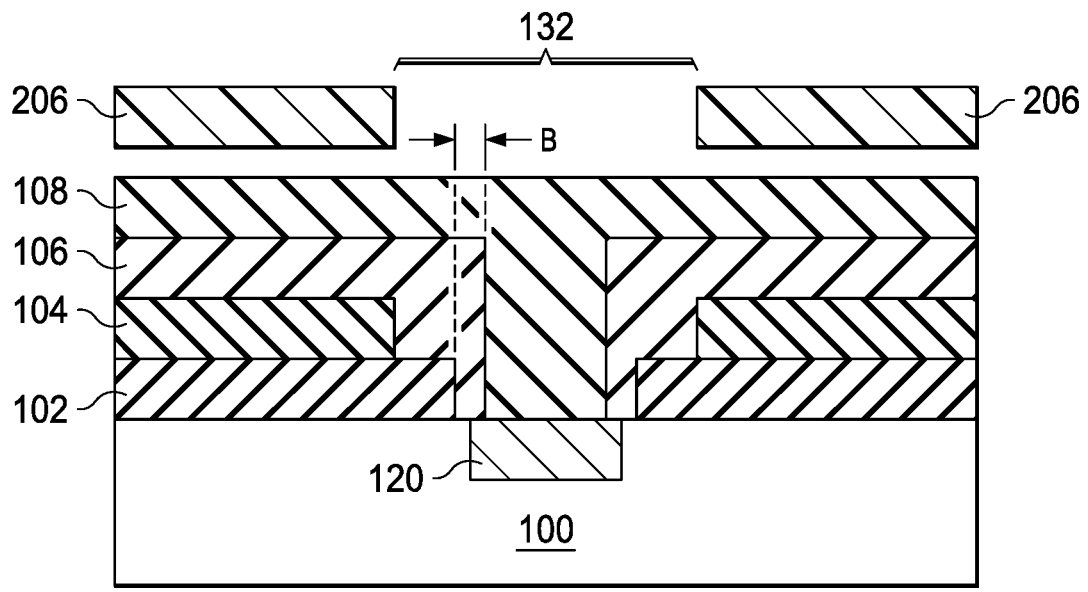

The IC contact opening 132 is smaller than the first and second contact openings so that after develop as shown in FIG. 6D the third photosensitive polyimide layer 106 overlaps the first 102 and second 104 photo sensitive polyimide layers within the first and second contact openings. A design rule B may specify the distance the third photosensitive polyimide layer 106 overlaps the first photosensitive polyimide layer 102 inside the first contact opening. The IC contact 132 is formed through the third photosensitive polyimide layer 106 only. No interfaces between photosensitive polyimide layers 102, 104, and 106 are exposed in the sidewalls of the IC contact 132. This avoids delamination that otherwise may occur when polymeric dielectric interfaces are exposed on the sidewall of an IC contact opening or on the sidewall of any other opening through multiple levels of polymeric dielectric. The third photosensitive polyimide layer 106 is then cured by baking it at a temperature of about 400° C. for a time of about 60 min producing a final thickness of about 5 to 20 um.

As shown in FIG. 6D a fourth layer of photosensitive polyimide 108 may be formed on the third photosensitive polyimide layer 106 and IC contact 132. The fourth layer of photosensitive polyimide may be added to provide additional protection to the integrated circuit during subsequent processing steps such as dicing and packaging. A fourth contact opening is exposed in the fourth photosensitive polyimide layer 108 using photo mask 206. The fourth contact opening is larger than the IC contact opening 132.

Figure 6E:
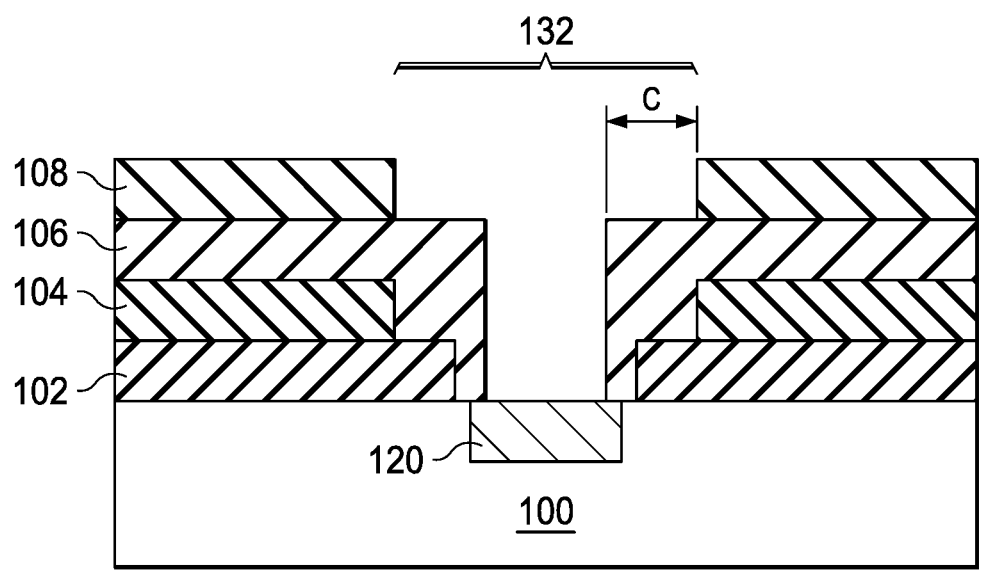

As shown in FIG. 6E, the fourth photosensitive polyimide layer 108 may then developed to form the fourth contact opening. The fourth contact opening is larger than the IC contact 132 so that the edge of the fourth photosensitive polyimide layer 108 is stair stepped away from the IC contact 132 by a distance C. This prevents the edge of the fourth photosensitive polyimide layer from being coincident with the edge of the third photosensitive polyimide layer 106 in the IC contact 132. This avoids delamination between the third photosensitive polyimide layer 106 and the fourth photosensitive polyimide passivation layer 108 which may occur if an interface between the two layers 106 and 108 is exposed on the sidewall within the IC contact opening 132. The fourth photosensitive polyimide layer 108 is then cured by baking it at a temperature of about 400° C. for a time of about 60 min producing a final thickness of about 5 to 20 um.

Those skilled in the art to which this invention relates will appreciate that many other embodiments and variations are possible within the scope of the claimed invention. For example how the invention relates to fewer or more levels of polymeric dielectric layers and how the invention relates to other types of openings through the multiple dielectric layers such as scribe seals or probe openings.

What is claimed is:

1. An integrated circuit, comprising:
multiple layers of polymer dielectric in the integrated circuit, including a first layer of polymer dielectric located directly on a metal interconnect;
multiple interfaces between the multiple layers of polymer dielectric; and
a first opening through a second layer of polymer dielectric of the multiple layers of polymer dielectric wherein the first opening has a vertical sidewall and wherein a portion of the second layer of polymer dielectric is located between the vertical sidewall and the multiple interfaces and extends to the metal interconnect.

2. The integrated circuit of claim 1, wherein the multiple layers of polymer dielectric include:
the first layer of polymer dielectric with a second opening larger than and concentric with the first opening; and
a third layer of polymer dielectric with a third opening that is larger than the second opening and wherein the third opening is concentric with the second opening and wherein an edge of the third opening is stair stepped away from the second opening.

3. The integrated circuit of claim 1, wherein the multiple layers of polymer dielectric include:
a third layer of polymer dielectric with a second opening and a first layer edge and wherein the second opening is larger than the first opening and wherein the second opening is concentric with the first opening; and
wherein the second layer covers the third layer edge.

4. The integrated circuit of claim 3, wherein the multiple layers of polymer dielectric include:
a third layer of polymer dielectric with a third opening and a third layer edge deposited on the second layer wherein the third opening is concentric with the first opening and wherein the third layer edge is stair stepped away from the first opening.

5. The integrated circuit of claim 1, wherein the polymer dielectric is a photosensitive polymer dielectric.

6. The integrated circuit of claim 5, wherein the photosensitive polymer dielectric is selected from the group consisting of polyimide, polybenzobisoxazole (PBO), SU-8 (epoxy-based photosensitive polymer), and BCB (benzocyclobutene-based photosensitive polymer).

7. The integrated circuit of claim 5, wherein the photosensitive polymer dielectric is a photosensitive polyimide.

8. The integrated circuit of claim 1, wherein the first opening is a scribe seal opening and where the vertical sidewall is a vertical sidewall of the scribe seal.

9. The integrated circuit of claim 1, wherein the first opening is a bondpad opening and the vertical sidewall is a vertical sidewall of the bondpad opening.

10. An integrated circuit comprising:
a metal pad;
a first layer of polymer dielectric over a second layer of polymer dielectric over a third layer of polymer dielectric, wherein:
   the first layer has a first opening over the metal pad,
   the second layer has a second opening at least partially over the metal pad, the second opening larger than the first opening and concentric with the first opening; and
   the third layer has a third opening at least partially over the metal pad, the third opening larger than the first opening and concentric with the first opening,
wherein the first opening has a vertical sidewall and wherein the first layer of polymer dielectric extends to the metal pad and is located between the vertical sidewall and the second and third layers.

11. The integrated circuit of claim 10, wherein the second opening is larger than the third opening.

12. The integrated circuit of claim 11, wherein an edge of the second opening is stair-stepped from an edge of the third opening.

13. The integrated circuit of claim 10, wherein the third opening is larger than the second opening.

14. The integrated circuit of claim 13, wherein the second layer extends over an edge of the third layer.

15. The integrated circuit of claim 10, wherein the polymer dielectric is a photosensitive polymer dielectric.

16. The integrated circuit of claim 15, wherein the photosensitive polymer dielectric is selected from the group consisting of polyimide, polybenzobisoxazole (PBO), SU-8 (epoxy-based photosensitive polymer), and BCB (benzocyclobutene-based photosensitive polymer).

17. The integrated circuit of claim 15, wherein the photosensitive polymer dielectric is a photosensitive polyimide.

18. An integrated circuit, comprising:
a first layer of polymer dielectric located over a metal interconnect and having a first opening over the metal interconnect;
a second layer of polymer dielectric located over the first layer of polymer dielectric having a second opening over the metal interconnect, the second opening having a larger width than the first opening, and a polymer-polymer interface being located between the second layer and the first layer; and
a third layer of polymer dielectric located over the second layer of polymer dielectric and within the first and second openings, the third layer of polymer dielectric extending toward and touching the metal interconnect and having a third opening with a vertical sidewall, a width of the third opening being less than the width of the first opening.

19. The integrated circuit of claim 18, wherein the metal interconnect includes a bond pad.

20. The integrated circuit of claim 18, wherein the metal interconnect is a part of a scribe seal.

21. The integrated circuit of claim 18, further comprising a fourth layer of polymer dielectric between the third layer and second layer.

22. The integrated circuit of claim 18, wherein the polymer dielectric is a photosensitive polymer dielectric.

23. The integrated circuit of claim 22, wherein the photosensitive polymer dielectric is selected from the group consisting of polyimide, polybenzobisoxazole (PBO), SU-8 (epoxy-based photosensitive polymer), and BCB (benzocyclobutene-based photosensitive polymer).

* * * * *